United States Patent [19]

Ogawa et al.

[11] Patent Number: 4,745,577
[45] Date of Patent: May 17, 1988

[54] SEMICONDUCTOR MEMORY DEVICE WITH SHIFT REGISTERS FOR HIGH SPEED READING AND WRITING

[75] Inventors: Junji Ogawa; Yoshihiro Takemae, both of Tokyo, Japan

[73] Assignee: Fujitsu Limited, Kawasaki, Japan

[21] Appl. No.: 798,284

[22] Filed: Nov. 15, 1985

[30] Foreign Application Priority Data

Nov. 20, 1984 [JP] Japan .................. 59-245802
Dec. 25, 1984 [JP] Japan .................. 59-275553

[51] Int. Cl.⁴ .................. G11C 19/00; G11C 7/00
[52] U.S. Cl. .................. 365/78; 365/221; 340/800
[58] Field of Search .......... 365/219, 220, 221, 240, 365/189, 78; 340/800, 799, 801, 802

[56] References Cited

U.S. PATENT DOCUMENTS

| | | | |
|---|---|---|---|
| 4,584,673 | 4/1986 | Kuijk | 365/219 |
| 4,599,710 | 7/1986 | Pelgrom et al. | 365/189 |
| 4,644,502 | 2/1987 | Kawashima | 365/240 |

Primary Examiner—Stuart N. Hecker
Assistant Examiner—Glenn A. Gossage
Attorney, Agent, or Firm—Staas & Halsey

[57] ABSTRACT

A semiconductor memory device with shift registers used for a video RAM, including a memory cell array, bit lines, and word lines, a pair of shift registers, and transfer gate circuits arranged between the bit lines and the shift registers. Each parallel data transfer circuit is provided between the shift registers for transferring parallel data between the shift registers, so that high-speed reading and writing of data for a CRT display is realized.

6 Claims, 9 Drawing Sheets

| OPERATING BITS (IN HEXADECIMAL NUMBER SYSTEM) | | INSTRUCTION |
|---|---|---|
| BIT 0 ~ BIT 3 | BIT 4 ~ BIT 7 | |
| 0 | 0 | NO OPERATION |
| 0 | 1 | AND |
| 0 | 2 | OR |
| 0 | 3 | EX·OR |
| ... | ... | ... |
| 1 | 0 | ADD |
| 1 | 1 | SUB |
| ... | ... | ... |

SEMICONDUCTOR MEMORY DEVICE WITH SHIFT REGISTERS FOR HIGH SPEED READING AND WRITING

BACKGROUND OF THE INVENTION

1. Field of the Invention

The present invention relates to a semiconductor memory device, more particularly to a random access memory (RAM) with a shift register for high-speed reading and writing. The RAM according to the present invention can be used for a video RAM.

2. Description of the Related Art

High-speed read/write shift registers are used in a video RAM for storing the picture data for a cathode ray tube (CRT) display in order to treat a large amount of data in a short time.

In order to increase the resolution of a picture on a display plane, it is necessary to increase the number of pixels of the picture. This requires the number of memory cells of the video RAM, and accordingly, the number of bit lines and word lines, to be increased. If the number of bit and word lines is increased, the number of elements (bits) of the shift register is increased. However, it is very difficult to carry out shifting-in and shifting-out of the data for a shift register having such a large number of bits.

There is a need for changing the data stored in a video RAM in order to change the picture displayed on the display plane. It is necesssary to read the data from the video RAM and simultaneously to write new data into the video RAM, when displaying a quickly changing picture.

SUMMARY OF THE INVENTION

It is an object of the present invention to provide an improved semiconductor memory device, with shift registers, capable of being used as a video RAM, in which the writing of data into and the reading of data from the memory cells of the RAM by shift registers can be carried out in either a parallel or serial manner.

According to the fundamental aspect of the present invention, there is provided a semiconductor memory device which includes a RAM having a memory cell array, a plurality of bit lines and a plurality of word lines. A pair of shift registers is adapted to be connected to the plurality of bit lines. Transfer gate units are arranged between the plurality of bit lines and the shift registers. A parallel data transfer unit is provided between the shift registers for carrying out the parallel data transfer between the shift registers.

According to another aspect of the present invention, there is provided a semiconductor memory device which includes a RAM having a memory cell array, a plurality of bit lines, and a plurality of word lines. An output shift register carries out serial reading, having data for one word line input in parallel from the memory cell array and having data serially output therefrom an input shift register inputs data for one word line supplied serially from an external data source. A parallel data transfer unit carries out logic processing of the data in the output shift register and the input shift register. An instruction decoder delivers an instruction for a selected logic operation which should be executed in the parallel data transfer unit. The data for one word line is supplied to the input shift register and an operation code for instructing a selected logic operation supplied to the instruction decoder is serially transmitted. The data for one word line is obtained as a result of the processing in the parallel data transfer unit according to the instructed selected logic operation which is written into the memory cells of a selected word line in the memory cell array.

DESCRIPTION OF THE PREFERRED EMBODIMENTS

Before entering into a description of the preferred embodiments, a prior art semiconductor memory device with shift registers used for a video RAM is described with reference to FIG. 1. The device of FIG. 1 includes a dynamic RAM 1 of an open bit-line type, groups of transfer gates 21 and 23, and shift registers 3 and 6. The RAM 1 includes sense amplifiers 101, 102, 103, ... 10$n$, bit lines (BL) 111, 112, 113, ... 11$n$, bit lines ($\overline{BL}$) 121, 122, 123, ... 12$n$, word lines (WL) 131, 132, 133, ... 13$n$ and 141, 142, 143, ... 14$n$. Memory cells (not shown) are provided at the intersections of the bit lines and the word lines. A pair of data buses (not shown) are provided along the sense amplifiers 101, 102, 103, ... 10$n$ for writing or reading the data. The shift register 3 includes the sequence of elements (bits) 301, 302, 303, ... 30$n$, the number n being, for example, 256. The elements 301, 302, 303, ... 30$n$ are connected through the transfer gates 211, 212, 213, ... 21$n$ to the bit lines BL 111, 112, 113, ... 11$n$ in the RAM 1. The elements 601, 602, 603, ... 60$n$ of the shift register 6 are connected through the transfer gates 231, 232, 233, ... 23$n$ to the bit lines $\overline{BL}$ 121, 122, 123, ... 12$n$ in the RAM 1.

By turning ON the gates 211, 212, 213, ... 21$n$ after the storage of data in the shift register elements 301, 302, 303, ... 30$n$ and the selection of one word line, data are written simultaneously into the memory cells at the intersections of the selected word line and the bit lines.

By shifting out the data in the shift register elements 301, 302, 303, ... 30$n$ after the transfer of the data from the memory cells at the intersections of a selected word line and the bit lines through the gates 211, 212, 213, ... 21$n$ to the shift register elements 301, 302, 303, ... 30$n$, the data in the shift register 3 are output from the shift register 3 in serial form.

In order to increase the resolution of a picture on a display plane, it is necessary to increase the number of pixels of the picture, which requires an increase in the number of memory cells of a video RAM, and accordingly, an increase in the number of bit lines and word lines. If the number of bit and word lines are increased, the number of bits of the shift register is increased. However, it is very difficult to carry out shifting-in and shifting-out of the data for a shift register having such a large number of bits.

The data stored in a video RAM must be changed in order to change the picture displayed on the display plane. It is necessary to read the data from the video RAM and simultaneously to write new data into the video RAM for displaying a quickly changing picture.

Under these circumstances, the use of two shift registers, in which one shift register is used for reading the data from the RAM, while the other shift register is used for writing the data in the RAM, may be considered. However, no satisfactory devices which meet the above-described requirements have yet been realized.

Figure 2:
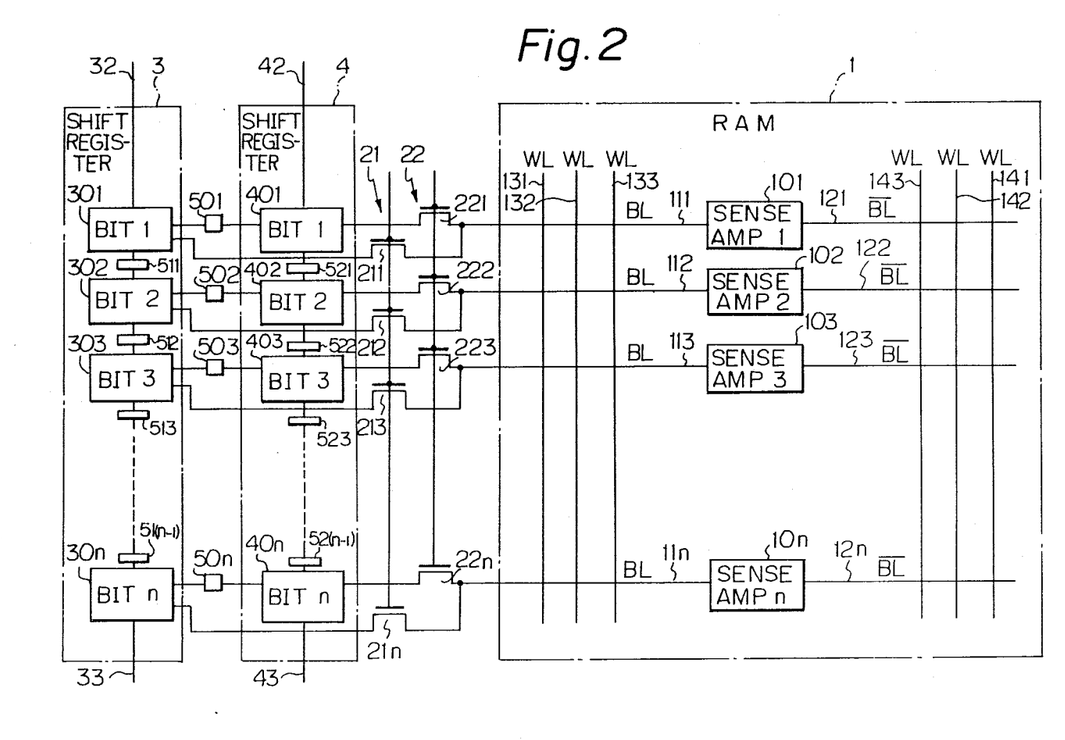
FIG. 2 is a semiconductor memory device with shift registers according to an embodiment of the present invention.

A semiconductor memory device with shift registers according to an embodiment of the present invention is shown in FIG. 2. The device of FIG. 2 includes a dynamic RAM 1 of an open bit-line type, groups of transfer gates 21 and 22, and shift registers 3 and 4.

The data are supplied through the input lines 32 and 42 of the shift registers 3 and 4. The data are delivered through the output lines 33 and 43 from the shift registers 3 and 4. If the shift register 3 is used, for example, exclusively for reading, the input line 32 can be omitted. If the shift register 4 is used, for example, exclusively for writing, the output line 43 can be omitted.

The RAM 1 includes sense amplifiers 101, 102, 103, . . . 10$n$, bit lines (BL) 111, 112, 113, . . . 11$n$, bit lines ($\overline{BL}$) 121, 122, 123, . . . 12$n$, word lines (WL) 131, 132, 133, . . . 13$n$ and 141, 142, 143, . . . 14$n$. Memory cells (not shown) are provided at the intersections of the bit lines and the word lines. A pair of data buses (not shown) are provided along the sense amplifiers 101, 102, 103, . . . 10$n$ for writing or reading the data. The shift register 3 includes the sequence of elements (bits) 301, 302, 303, . . . 30$n$ and shift register gates 511, 512, 513, . . . 51(n−1). The shift register 4 includes the sequence of elements (bits) 401, 402, 403, . . . 40$n$ and shift register gates 521, 522, 523, . . . 52(n−1). Between the elements 301, 302, 303, . . . 30$n$ of the shift register and the elements 401, 402, 403, . . . 40$n$ of the shift register 4, there are provided shift register gates 501, 502, 503, . . . 50$n$.

Figure 3:
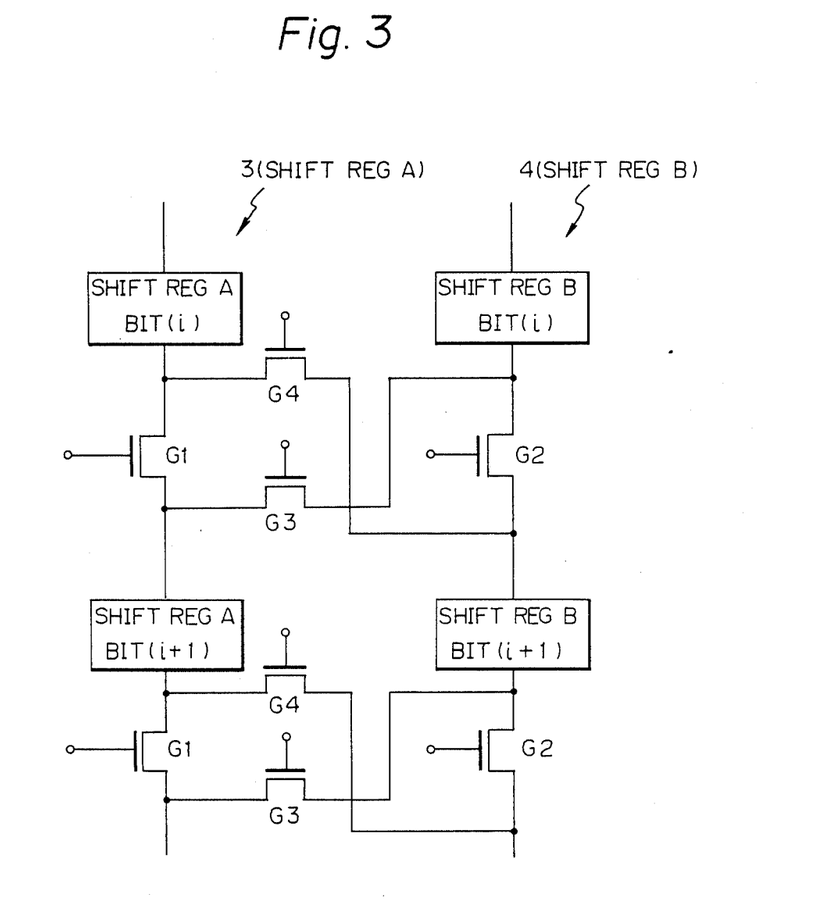
FIG. 3 is an example of the actual arrangement of the shift register gates in the device of FIG. 2.

An example of the actual arrangement of the shift register gates 501, 502, 503, . . . 50$n$; 511, 512, 513, . . . 51$n$; and 521, 522, 523, . . . 52$n$ is shown in FIG. 3. In the arrangement shown in FIG. 3, the shift register gates are represented as G1 between the adjacent elements BIT(i) and BIT(i+1) of the shift register 3 (shift register A), G2 between the adjacent elements BIT(i) and BIT(i+1) of the shift register 4 (shift register B), G3 between the input terminal of the element BIT(i+1) of the shift register 3 and the output terminal of the element BIT(i) of the shift register 4, and G4 between the output terminal of the element BIT(i) of the shift register 3 and the input terminal of the element BIT(i+1) of the shift register 4.

In the case where the shift register 3 is used exclusively for reading, while the shift register 4 is used exclusively for writing, the shift register gates G1 and G2 should be in the ON state, while the shift register gates G3 and G4 should be in the OFF state.

Contrary to this, in the case where parallel transfer of data from the shift register 3 to the shift register 4 is carried out, the shift register gates G1 and G3 should be in the ON state, while the shift register gates G2 and G4 should be in the OFF state.

Further, in the case where parallel transfer of data from the shift register 4 to the shift register 3 is carried out, the shift register gates G2 and G4 should be in the ON state, while the shift register gates G1 and G3 should be in the OFF state.

Figure 1:
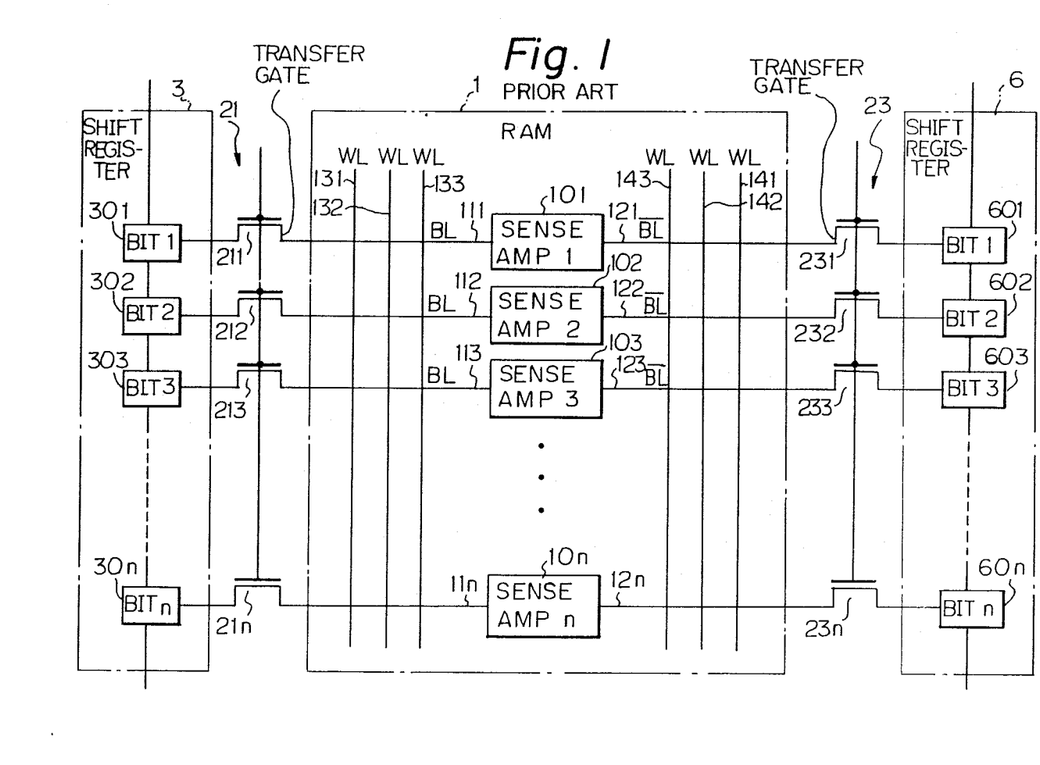
FIG. 1 is a prior art semiconductor memory device with shift registers.

The device of FIG. 1 including the circuit of FIG. 2 can be used for a scroll display operation in the upward direction in a cathode ray tube (CRT) display. In this case, the shift register 3 is used for reading, while the shift register 4 is used for writing. The data for one word line is transferred first to the shift register 3, and next to the shift register 4. After that, a shift operation of the shift register 3 takes place, so that the video signal is supplied to the CRT and the data of the shift register 4 is supplied to the immediately preceding word line for which scanning has already been completed. This operation is successively repeated. Thus, a scroll display operation in the upward direction is carried out.

Figure 4:
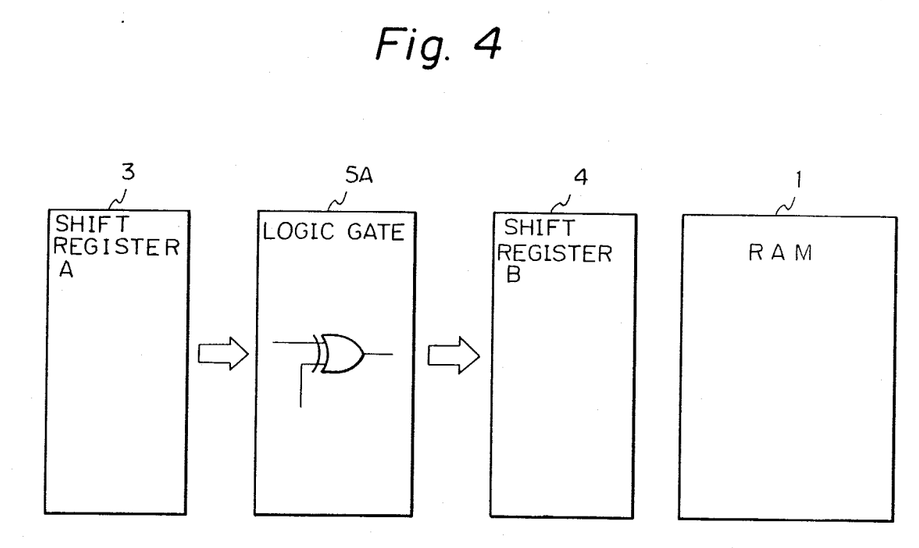
FIGS. 4 and 5 are modified embodiments of the present invention.
Figure 5:
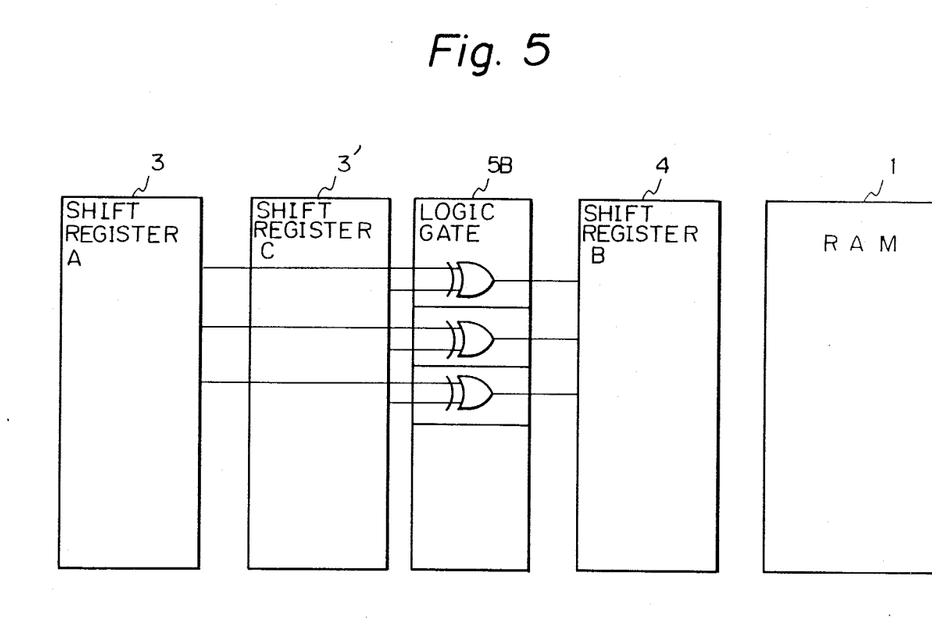

Modified embodiments of the present invention are shown in FIGS. 4 and 5. In the device of FIGS. 4 and 5, logic gates 5A and 5B are provided between the shift registers 3 and 4. The display of a negative picture based on a positive picture can be carried out quickly by using the devices of FIGS. 4 and 5.

In the devices of FIGS. 4 and 5, the logic gates 5A and 5B include exclusive OR gates. The OR gates operate as "through" elements when one of the input signals is "0" and operate as inverter elements when one of the input signals is "1". After registering one word line data of RAM 1 in the shift register 3, the logic gate 5A, if supplied with "1" at each input of each exclusive OR gate, inverts the data in the shift register 3 and transfers, in parallel, inverted data to the shift register 4, and the data are written in the memory cells of the selected word line through the shift register 4. Alternatively, the data can be read out through the shift register 4 to the exterior. By carrying out this operation on the entire display, inversion between the positive picture and negative picture is quickly realized. If selection of a word line is changed, displacement of the picture is also realized.

The device shown in FIG. 5 having the shift register 3' (shift register C) is suitable for supplying a control input signal to one of the input terminals of the exclusive OR gates. By supplying mask data to the shift register 3', a partial-inversion and remainder operation can be realized.

In another modified embodiment in which three shift registers are provided, it is possible to carry out data exchanges between two of the three shift registers.

In another embodiment in which two shift registers and storage units are provided, the number of storage units being equal to the number in elements of the shift register, it is possible to carry out data exchange between two of the three shift registers.

In another embodiment in which the RAM is divided into two portions and each of the two shift registers is associated exclusively with one of the portions of the RAM, it is possible to carry out data exchange between the two shift registers.

Figure 6:
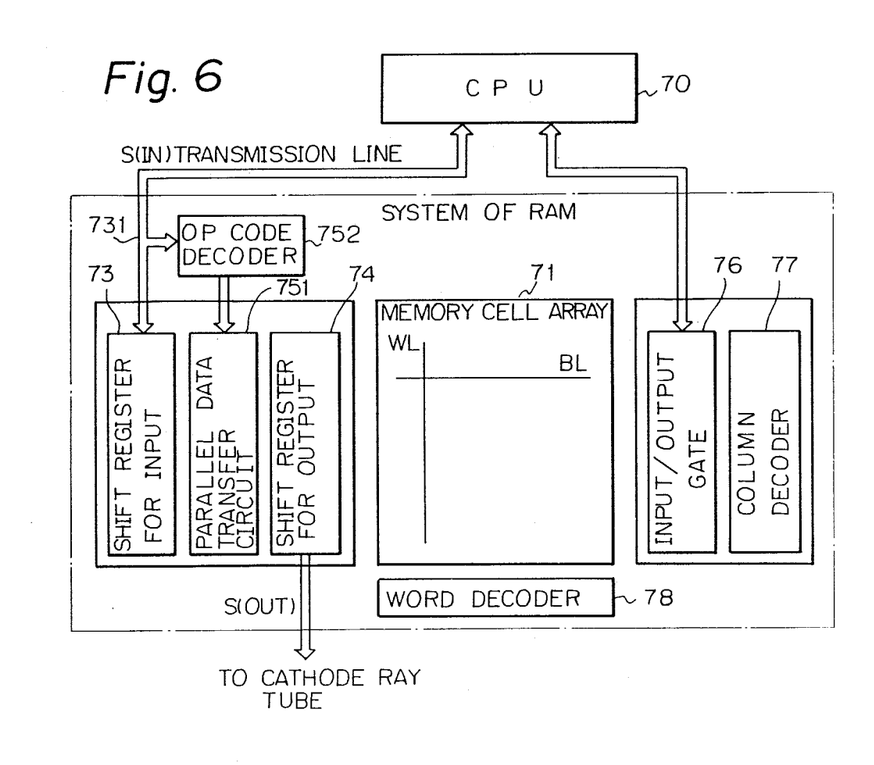
FIG. 6 is a further modified embodiment of the present invention.

A further modified embodiment of the present invention is shown in FIG. 6. The RAM system in the device shown in FIG. 6 includes a memory cell array 71 having bit lines (BL), word lines (WL), and memory cells (not shown); an input shift register 73; an output shift register 74; a parallel data transfer circuit 751; an operation code (OP code) decoder 752; an input/output gate 76; a column decoder 77; and a word decoder 78. The RAM system is connected to the central processor unit (CPU) 70.

Serial data are transmitted from the CPU 70 through the transmission line to the input shift register 73 and the operation code decoder 752.

The input shift register 73 registers serial data for one word line. The parallel data transfer circuit 751 carries out logic processing of the data registered in the input shift register 73 and the output shift register 74 to generate new data for one word line. The parallel data transfer circuit 751 has logic functions such as AND and OR. The selection of the logic function of the parallel data transfer circuit 751 is designated by the output of the operation code decoder 752. The operation code for designating the logic processing to be selected is transmitted together with the data for one word line from the CPU 70 through the transmission line to the operation code decoder 752, where the sent operation code is decoded and supplied to the parallel data transfer circuit 751. The operation code decoder 752 and the parallel data transfer circuit 751 are connected through n signal lines, n being equal to the number of kinds of logic processing. The designation of the selected kind of logic processing is carried out by making the potential of the signal line corresponding to the selected kind of logic processing a HIGH logic level.

The data for one word line which is to be supplied to the input shift register 73 is determined by the logic processing signal which is applied to the picture data stored in the memory cell array 71. If an OR logic function is to be used, the result of the OR logic processing with regard to the new picture data supplied to the input shift register 73 is the superposition of the old and new pictures. For example, when blue line data stored in the memory cell array 71 is to be changed into red line data, the parallel data transfer circuit 751 acts as a circuit for detecting the blue line data and changes the detected blue line data into red line data. The data supplied to the input shift register 73 is mask data, which instructs in which portion of the word lines the processing in question should be executed.

Figure 7:
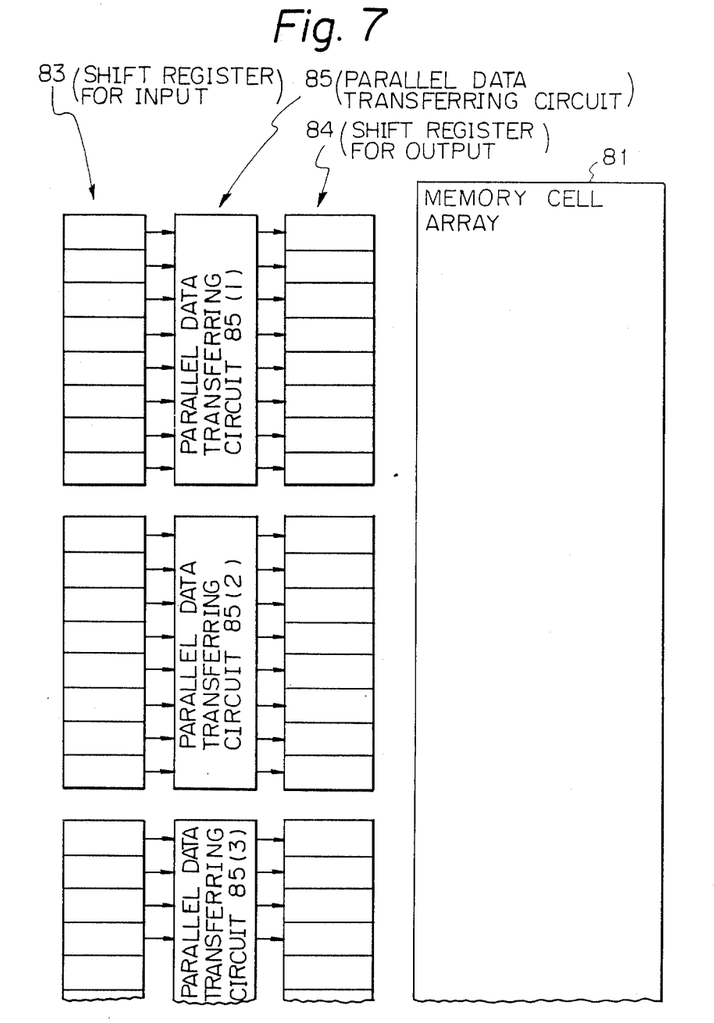
FIG. 7 is a still further modified embodiment of the present invention.

A still further modified embodiment of the present invention is shown in FIG. 7. The device of FIG. 7 is designed for the case where one pixel is represented by 8 bits. It should be noted that one pixel of a color picture consists of at least 3 bits, that is, R, G, and B, and one pixel of a monochromatic picture consists of plural bits if the monochromatic picture has a variety of color densities. Such a situation can be dealt with by providing as many of memory cell arrays 81, input shift registers 83, output shift registers 84, and parallel data transfer circuits 85 as the number of bits for one pixel.

In the device of FIG. 7, the parallel data transferring circuit 85 includes the assemblies of the parallel data transferring circuits 85(1), 85(2), 85(3), and so on.

Figure 8:
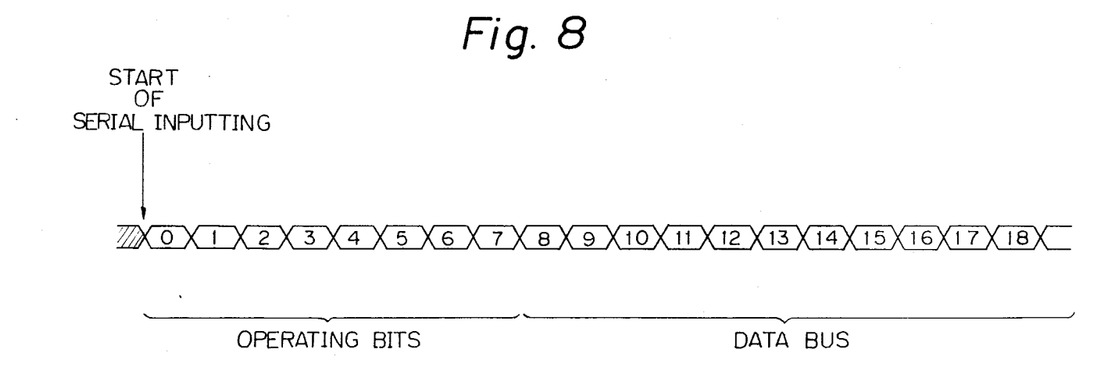
FIG. 8 is an example of the serial data used in the embodiment of FIG. 7.

An example of the serial data used in the device of FIG. 7 is shown in FIG. 8. In FIG. 8, the first eight (8) bits are the operating bits, that is, the operating code. Each of the former 4 bits (BIT 0 to BIT 3) and the latter 4 bits (BIT 4 to BIT 7) has a value of 0 to 9, A, B, C, D, E, or F in the hexadecimal number system. An example of the instructions represented by the operating bits is shown in FIG. 9.

Figure 9:
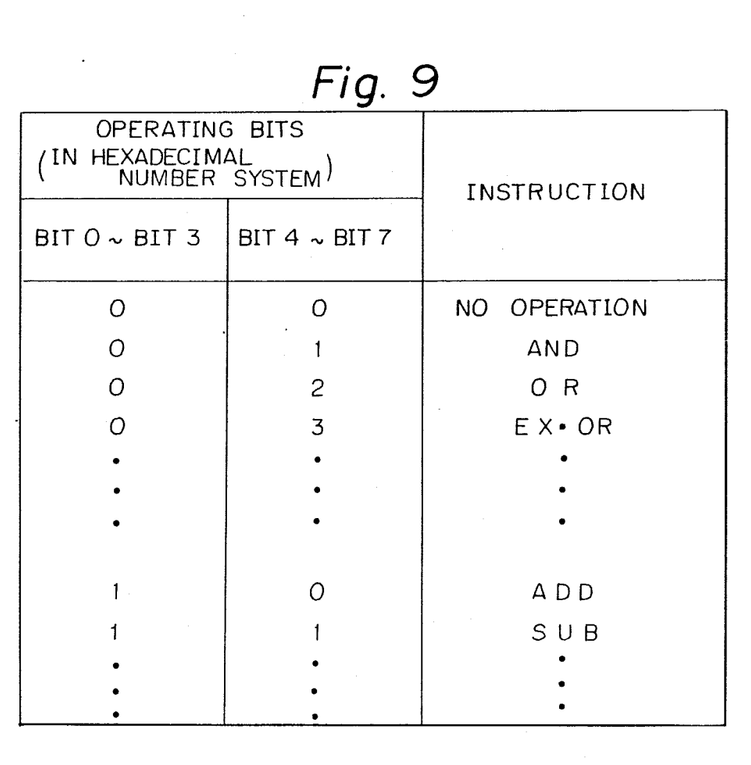
FIG. 9 is a table of the relationship between the operating bits and the instructions.

The data bits for one word line follow the operating bits BIT 0 to BIT 7 shown in FIG. 9. Each eight (8) bits, such as BIT 8 to BIT 15 and BIT 16 to BIT 23, correspond to one pixel. Thus, by including the operating bits in the serial data series for the data bits, the input line 731 (FIG. 6) can be used both for the operating code and the data so that the number of external terminals for the RAM system need not be increased.

The device of FIG. 7 has a usual read/write mode using a data bus, a serial read mode using an output shift register, and a serial write mode using an input shift register. In the serial write mode, serial data S(IN) having the format shown in FIG. 8 are delivered from the CPU 70 through the S(IN) transmission line.

Upon receipt of the serial data S(IN), the operation code decoder 752 decodes the first 8 bits, which is the operating code, and the output of the operation code decoder 752 carries out the selection of the processing in the parallel data transfer circuit 751 according to the instructions, as shown in FIG. 9.

The data bits of the serial data S(IN) for one word line are registered in the input shift register 73. The operating code is automatically shifted out of the input shift 73. The processing in the parallel data transfer circuit 751 is started after the data bits for one word line are registered in the input shift register 73.

The new data resulting from the processing are written in parallel in the memory cell array connected to the selected word line in the memory cell array 71. In the case where the word line to which the writing is carried out is the word line from which the data is read for the output shift register 74, the operation updates the picture data. In the case where the word line to which the writing is carried out is the line next to the above-mentioned read word line, the operation includes scrolling the picture in addition to updating the picture data.

Parallel transmission lines are provided between the output shift register 74 and the memory cell array 71. Hence, new data resulting from the processing are first registered in the output shift register 74 and are subsequently written in the corresponding word line in the memory cell array 71.

When the data in the output shift register 74 are all 0 without reading the data from the memory cell array 71 to the output shift register 74, and writing is carried out under an OR logic process of the parallel data transfer circuit 751, the data stored in the memory cell array 71 are converted into the data registered in the input shift register 73, so that high-speed writing is realized.

We claim:

1. A semiconductor memory device comprising:
   a random-access memory having a memory cell array, a plurality of bit lines, and a plurality of word lines intersecting said plurality of bit lines;
   first and second shift registers, respectively, operatively connected to said plurality of bit lines;
   first and second transfer gate means operatively connected between said plurality of bit lines and said first and second shift registers, respectively; and
   parallel data transfer means, operatively connected between said first and second shift registers, for carrying out a parallel data transfer between said first and second shift registers independently of said first and second transfer gate means.

2. A device according to claim 1, wherein said parallel data transfer means comprises logic gates for effecting logic processing of the data to be transferred.

3. A device according to claim 2, wherein said logic gates are exclusive OR gates.

4. A device according to claim 3, wherein said logic gates include a plurality of input terminals, and wherein an additional shift register is connected to one of said input terminals of each of said logic gates.

5. A semiconductor memory device operatively connected to receive data from an external data source comprising:
- a random-access memory having a memory cell array including memory cells, a plurality of bit lines, and a plurality of word lines intersecting said plurality of bit lines;
- an output shift register, operatively connected to said random-access memory, data from one of a selected one of said word lines being input in parallel into said output shift register and being serially output from said output shift register;
- an input shift register for inputting data supplied serially from the external data source to a selected one of said word lines;
- parallel data transfer means, operatively connected to said input shift register and said output shift register, for carrying out logic processing of the data in said output shift register and said input shift register; and
- an instruction decoder, operatively connected to said parallel data transfer means, for delivering an instruction for a selected logic operation to be executed in said parallel data transfer means;
- the data for one of said word lines supplied to said input shift register and the instruction for instructing a selected logic operation being serially transmitted;
- the data for one word line output from said parallel data transfer means according to said instruction for a selected logic operation being written into said memory cells of a selected one of said word lines in said memory cell array.

6. A semiconductor memory device connected to an external data source providing external data and operatively connected to receive instructions for selecting a logic function, comprising:
- a random-access memory including:
  - a memory cell array having a plurality of memory cells;
  - bit lines; and
  - word lines intersecting said bit lines;
- decoder means, operatively connected to receive the instructions, for decoding the instructions for selecting a logic function and outputting said decoded instructions;
- an input shift register, operatively connected to said external data source, for inputting external data supplied serially from the external data source to said word lines;
- an output shift register, operatively connected to said memory cell array and said input shift register, data for one of said word lines being input in parallel to said output shift register and being output in serial to an external circuit; and
- parallel data transfer means, operatively connected to said decoder means and between said input and output shift registers, for performing a selected logic processing on said data transferred from said input shift register to said output shift register in accordance with said decoded instructions output from said decoder means.

* * * * *